(12) United States Patent
Lin

(10) Patent No.: US 11,972,973 B1
(45) Date of Patent: Apr. 30, 2024

(54) SEMICONDUCTOR STRUCTURE AND METHOD OF MANUFACTURING A SEMICONDUCTOR STRUCTURE

(71) Applicant: Chun-Ming Lin, Hsinchu County (TW)

(72) Inventor: Chun-Ming Lin, Hsinchu County (TW)

( * ) Notice: Subject to any disclaimer, the term of this patent is extended or adjusted under 35 U.S.C. 154(b) by 0 days.

(21) Appl. No.: 18/480,567

(22) Filed: Oct. 4, 2023

(51) Int. Cl.
*H01L 21/768* (2006.01)
*H01L 23/532* (2006.01)

(52) U.S. Cl.
CPC .... *H01L 21/76802* (2013.01); *H01L 21/7688* (2013.01); *H01L 23/53238* (2013.01)

(58) Field of Classification Search
CPC ........... H01L 21/76802; H01L 21/7688; H01L 23/53238
See application file for complete search history.

(56) References Cited

U.S. PATENT DOCUMENTS

| | | |
|---|---|---|
| 5,663,101 A | 9/1997 | Cronin et al. |
| 7,579,274 B2 | 8/2009 | Gonzalez et al. |
| 9,000,600 B2 * | 4/2015 | Uzoh ................ H01L 21/76885 257/737 |
| 9,029,071 B2 | 5/2015 | Shinde et al. |
| 10,714,341 B2 | 7/2020 | Cohen et al. |
| 2023/0138988 A1 * | 5/2023 | Motoyama .......... H01L 23/5226 257/774 |
| 2023/0352612 A1 * | 11/2023 | Li ........................... H01L 31/07 |
| 2023/0387020 A1 * | 11/2023 | Liu ................... H01L 23/53295 |
| 2023/0395504 A1 * | 12/2023 | Chen ................ H01L 21/76834 |

\* cited by examiner

*Primary Examiner* — Karen Kusumakar
(74) *Attorney, Agent, or Firm* — WPAT, P.C.; Anthony King

(57) ABSTRACT

The present application discloses a semiconductor structure and a method of manufacturing a semiconductor structure. The semiconductor structure includes a conductive line of an $N^{th}$ metal layer, a first insulating layer, a dielectric layer, a second insulating layer, an interconnect base, and an interconnect body. The first insulating layer is on the conductive line and free from covering a portion of the conductive line. The dielectric layer is on the first insulating layer and free from covering the portion of the conductive line. The second insulating layer is on the dielectric layer and free from covering the portion of the conductive line. The interconnect base is laterally surrounded by the dielectric layer, the first insulating layer, and the second insulating layer. A top surface of the interconnect base and a top surface of the second insulating layer are coplanar.

24 Claims, 16 Drawing Sheets

SEMICONDUCTOR STRUCTURE AND METHOD OF MANUFACTURING A SEMICONDUCTOR STRUCTURE

TECHNICAL FIELD

The present disclosure relates to a semiconductor structure, and more particularly, to a semiconductor structure including interconnects manufactured by a modified Damascene method to reduce the use of chemical-mechanical polishing (CMP) process.

BACKGROUND

Damascene processes are well-known semiconductor manufacturing processes used to fabricate copper interconnects. A copper Damascene process provides a solution to form conductive traces coupled to a via without a need to etch copper components. A dual Damascene process allows formation of both conductive vias and conductive traces through a single copper-depositing process. Generally, the Damascene processes require CMP processes to flatten a surface of a copper layer. However, the CMP process is time consuming and may cause reliability problems, and a slurry adopted for polishing metal is expensive. Therefore, there is a demand for a more cost-effective and resources-saving method of forming the interconnects and conductive lines.

SUMMARY

One aspect of the present disclosure discloses a semiconductor structure. The semiconductor structure includes a conductive line of an $N^{th}$ metal layer, a first insulating layer, a dielectric layer, a second insulating layer, an interconnect base, and an interconnect body, where N is an integer equal to 1 or greater. The first insulating layer is on the conductive line and free from covering a portion of the conductive line. The dielectric layer is on the first insulating layer and free from covering the portion of the conductive line and a portion of the first insulating layer. The second insulating layer is on the dielectric layer and free from covering the portion of the conductive line. The interconnect base is laterally surrounded by the dielectric layer, the first insulating layer, and the second insulating layer. A top surface of the interconnect base and a top surface of the second insulating layer are coplanar. The interconnect body is over the second insulating layer and in contact with the top surface of the interconnect base.

Another aspect of the present disclosure provides a method of manufacturing a semiconductor structure. The method includes receiving a wafer having a conductive line of an $N^{th}$ metal layer at a surface of the wafer, wherein N is an integer equal to 1 or greater, forming a first insulating layer on the surface of the wafer and free from covering a portion of the conductive line, forming a dielectric layer (e.g. using low-k dielectric material) on the first insulating layer, forming a second insulating layer on the dielectric layer and the first insulating layer, wherein the second insulating layer comprises at least a base region over the portion of the conductive line, and forming an interconnect base in the base region. The operation of forming the interconnect base in the base region includes forming a photoresist layer over the second insulating layer, wherein the base region of the second insulating layer is free from covered by the photoresist layer, forming at least one conductive material over the photoresist layer, the second insulating layer, and the conductive line, wherein an upper surface of the conductive material over the conductive line is substantially coplanar with an upper surface of the second insulating layer, and removing the conductive material over the second insulating layer by removing the photoresist layer to form the interconnect base by using a lift-off process. Furthermore, another photolithography process is applied, and a lift-off process is applied once again for forming the interconnect body and the conductive traces over different regions with and without interconnect base. The results of the proposed modified Damascene method are similar to the single Damascene method. That is, the interconnect base and the conductive lines over the interconnect base can be formed by two lift-off processes respectively. As a result, the number of CMP process can be reduced.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

The embodiments of the present disclosure provide methods for manufacturing semiconductor structures and the semiconductor structures thereof. The methods for manufacturing the semiconductor structures includes modified version of Damascene processes that are able to form both the conductive terminals in the front-end-of-line (FEOL) and the conductive lines in back-end-of-line (BEOL) by utilizing one or more than one lift-off processes respectively so as to reduce the usage of CMP processes. Therefore, the great amount of resource and time required by the CMP processes can be saved. Furthermore, the semiconductor structures provided by the embodiments of the present disclosure is suitable for high frequency signal transmission, and can even be applied to form Monolithic Microwave Integrated Circuits (MMICs) or 3D MMICs therein.

Figure 1:
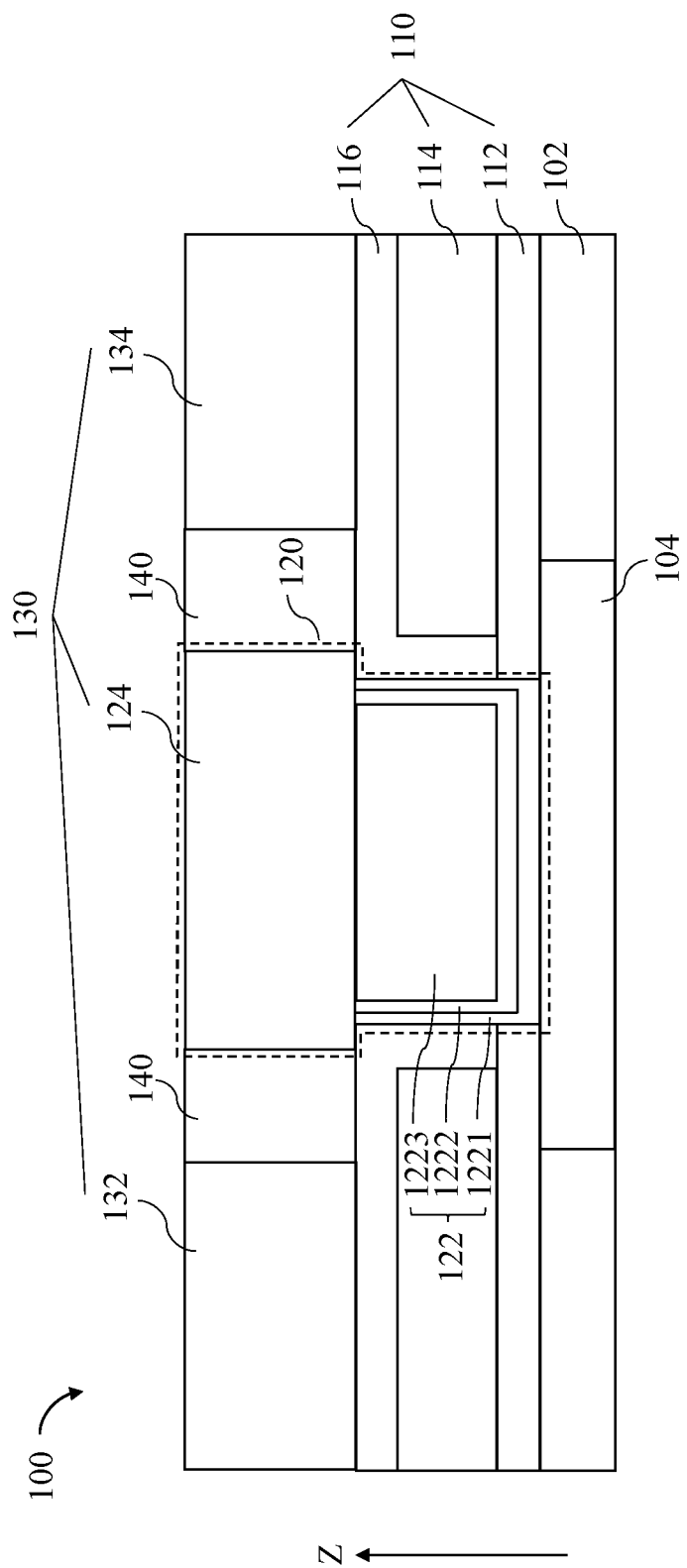
FIG. 1 shows a semiconductor conductive via structure according to one embodiment of the present disclosure.

FIG. 1 shows a semiconductor structure 100 according to one embodiment of the present disclosure. The semiconductor structure 100 includes a wafer 102, a conductive line 104 formed in the wafer 102, an inter-layer dielectric layer 110, an interconnect base 122 formed in the inter-layer dielectric layer 110 and in contact with the conductive line 104, and a metal layer 130 including an interconnect body 124 formed over the interconnect base 122. In the present embodiment, the conductive line 104 can be in an $N^{th}$ metal layer, and the interconnect body 124 can be a part of a conductive line in an $(N+1)^{th}$ metal layer (i.e., the metal layer 130). In such case, the interconnect 120 including the interconnect base 122 and the interconnect body 124 can provide vertical electronic connection between conductive lines in metal layers of two different levels. That is, the interconnect 120 can provide additional electronic connections to the conductive line 104 so that the conductive line 104 can be coupled to other conductive traces or external circuits.

In the following description, elements in the semiconductor structure 100 will be introduced individually and respectively. First, some possible manufacturing methods and structures of the conductive line 104 will be introduced, and then, some possible manufacturing methods and structures of the interconnect base 122 will be presented. Finally, some possible manufacturing methods and structures of the metal layer 130 or like will be described.

In the present embodiment, the conductive line 104 may be an input/output electrode (i.e., including sources, drains, and gates) of FET (or other terminals of other types of transistors) formed in the wafer 102. In such case, the conductive line 104 is formed in a front-end-of-line (FEOL) process, and may include copper, cobalt, ruthenium, aluminum, tungsten, other conductors, or a combination thereof. However, the present disclosure is not limited thereto. In some embodiments, the conductive line 104 can be a part of a metal layer manufactured in a back-end-of-line (BEOL) process.

In some embodiments, before forming the inter-layer dielectric layer 110 and the interconnect base 122 on the conductive line 104 and the wafer 102, if surfaces of the conductive line 104 and the wafer 102 are not even and fail to satisfy the requirement of photolithography depth of focus (DoF), a polish process, such as a CMP process, may be performed, thereby facilitating the formation of the inter-layer dielectric layer 110 and the interconnect base 122. However, in the present disclosure, to reduce the use of the CMP process so as to reduce the required cost and time, a method for forming the conductive line 104 in the wafer 102 with a flat surface that can meet the requirement of DoF is also proposed.

In some embodiments, if the uneven surfaces of the conductive line 104 and the wafer 102 can be planarized by a spin on glass (SoG) process to reduce the usage of the CMP process, then the SoG process would be preferred for its low cost. However, if the uneven degree of the surfaces of the conductive line 104 and the wafer 102 is beyond the planarizing capability of the SoG process, lift-off processes for depositing metal materials (e.g., tungsten) under high temperature on the wafer 102 may be considered in the first place so that the conductive line 104 and the wafer 102 can have even surfaces upon their formation.

Figure 2A:
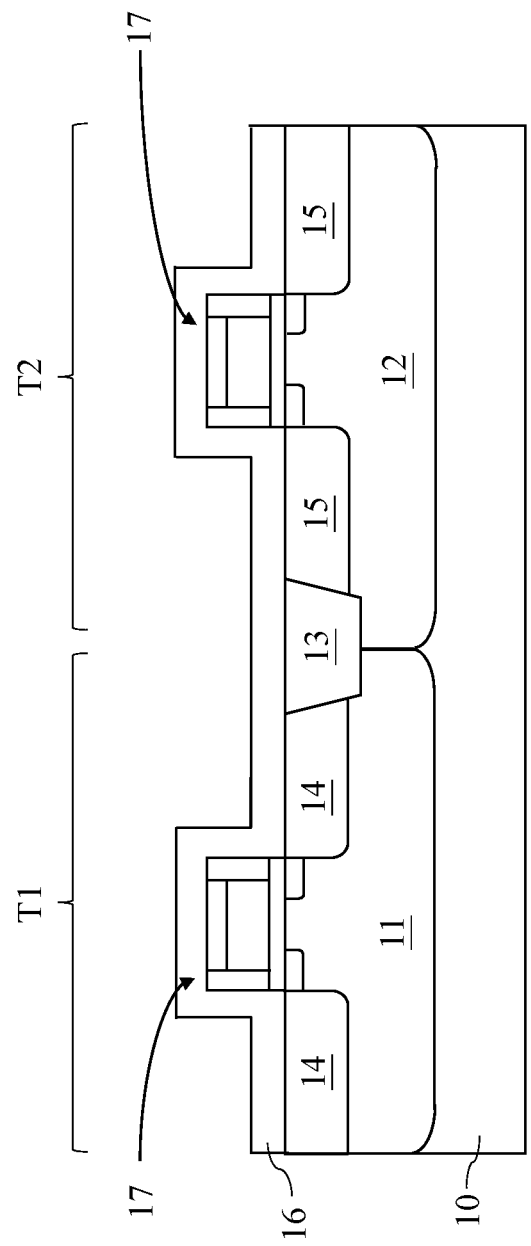
FIGS. 2A to 2D are cross-sectional diagrams showing a manufacturing process of forming the input/output terminals of CMOS transistors according to one embodiment of the present disclosure.

One embodiment of the present disclosure provides a method M1 of manufacturing input/output electrodes (formed under high temperature) of transistors by utilizing lift-off processes. FIGS. 2A to 2D are cross-sectional diagrams showing a manufacturing process of forming the input/output electrodes of a CMOS transistors according to the method M1. In FIG. 2A, an NMOS transistor T1 and a PMOS transistor T2 are formed in the P-type substrate 10. The NMOS transistor T1 includes a P-well 11 formed in the substrate and two N-type doped regions 14 (i.e., source/drain) formed in the P-well 11. The PMOS transistor T2 includes an N-well 12 formed in the substrate 10 and two P-type doped regions (i.e., source/drain) formed in the N-well 12. As shown in FIG. 2A, the NMOS transistor T1 and the PMOS transistor T2 can be separated by the shallow trench isolation (STI) structure 13. In the present embodiment, the method M1 is adopted to form the input/output electrodes (i.e., the input/output plugs) of the transistors T1 and T2. The method M1 includes steps S110 to S190 as follows.

S110: Form an inter-layer dielectric layer 16 over transistors T1 and T2 that are formed on a P-type substrate 10 as shown in FIG. 2A.

Figure 2B:
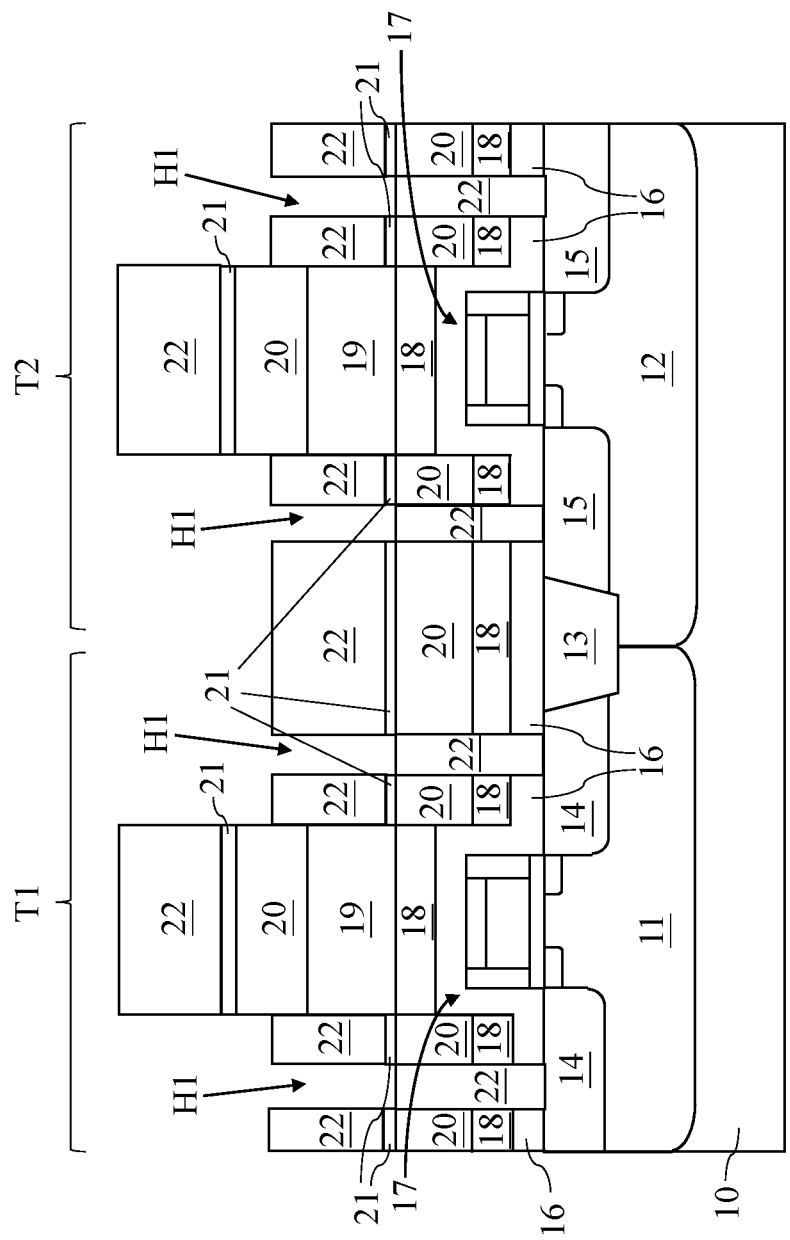

S120: Form a first silicate glass layer 18 on the inter-layer dielectric layer 16 as shown in FIG. 2B.

S130: Form a first silicon nitride (SiN) layer 19 only on those parts of the first silicate glass layer 18 that are disposed on first terminals 17 of the transistors T1 and T2.

S140: Form a second silicate glass layer 20 on the first silicate glass layer 18 and the first SiN layer 19.

S150: Form a second SiN layer 21 on the second silicate glass layer 20.

S160: Form first openings H1 on second terminals 14 and 15 of the transistors T1 and T2.

S162: Deposit a layer of TiN (not shown) and a first layer of electrode metal 22 (including tungsten, cobalt or ruthenium) to fill the first openings H1.

S170: Remove exposed portions of the second silicate glass layer 20.

Figure 2C:
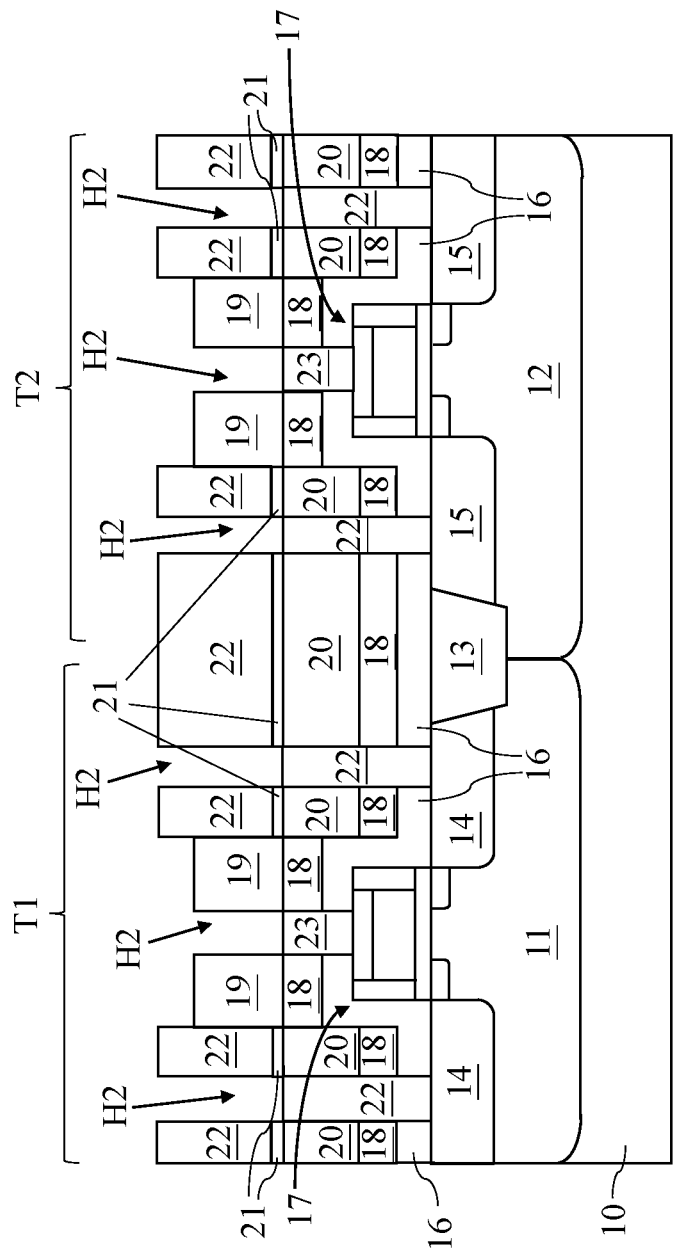

S180: Form second openings H2 on the first terminals of the transistors T1 and T2 as shown in FIG. 2C.

S182: Deposit a layer of TiN (not shown) and a second layer of electrode metal 23 (including tungsten, cobalt or ruthenium) to fill the second openings H2 as shown in FIG. 2C.

S190: Remove the first SiN layer 19 and the second SiN layer 21.

A briefing of Method M1 is as follows. As shown in FIG. 2A, the inter-layer dielectric layer 16 is formed on the transistors T1 and T2 (S120). After the inter-layer dielectric layer 16 is formed, as shown in FIG. 2B, the first silicate glass layer 18, the first SiN layer 19 (S130), the second silicate glass layer 20 (S140), and the second SiN layer 21 (S150) are formed sequentially. It should be noted that, the first SiN layer 19 is only formed on parts of the first silicate glass layer 18 that are disposed on the first terminals 17 of the transistors T1 and T2. Also, the second SiN layer 21 is patterned to form the first openings H1 on the second terminals 14 and 15 of the transistors T1 and T2 in step S160, respectively. In the present embodiments, the second terminals 14 and 15 are at a depth deeper than a depth at which the first terminals 17 are disposed. For example, the first terminals 17 can be the gates of the transistors T1 and T2, and the second terminals 14 and 15 can be sources/drains of the transistors T1 and T2.

Note that the inter-layer dielectric layer 16, the first silicate glass layer 18, the first SiN layer 19, the second silicate glass layer 20, as well as the second SiN layer 21 may be formed by high temperature processes in FEOL. Thus, the lift-off method is described as a "lift-off process for materials formed in high temperatures" in the present disclosure.

Next, in step S162, as shown in FIG. 2C a layer of TiN (2-10 nm, not shown) and a layer of electrode metal 22 (including tungsten, cobalt or ruthenium) can be deposited on the second SiN layer 21 and fill the first openings H1 on the second terminals 14 and 15 of the transistors T1 and T2, thereby forming the input/output electrodes coupled to the second terminals 14 and 15 of the transistors T1 and T2. In some embodiments, the TiN layer can be a wetting layer for tungsten deposition, and the TiN layer may, for example, but not limited to, have a thickness from 2 nm to 10 nm.

After the input/output electrodes coupled to the second terminals 14 and 15 of the transistors T1 and T2 are formed, the exposed portions of the second silicate glass layer 20 can be removed by deep reactive ion etching (DRIE) in step S170. In such case, the second SiN layer 21, TiN (not shown) and the electrode metal layer 22 formed on the exposed second silicate glass layer 20 will also be removed. In some embodiments, the silicate glass layers 18 and 20 can be phospho-silicate glass (PSG) layers preferably. Alternatively, the silicate glass layers 18 and 20 can be boron-phospho-silicate (BPSG) layers.

Figure 2D:
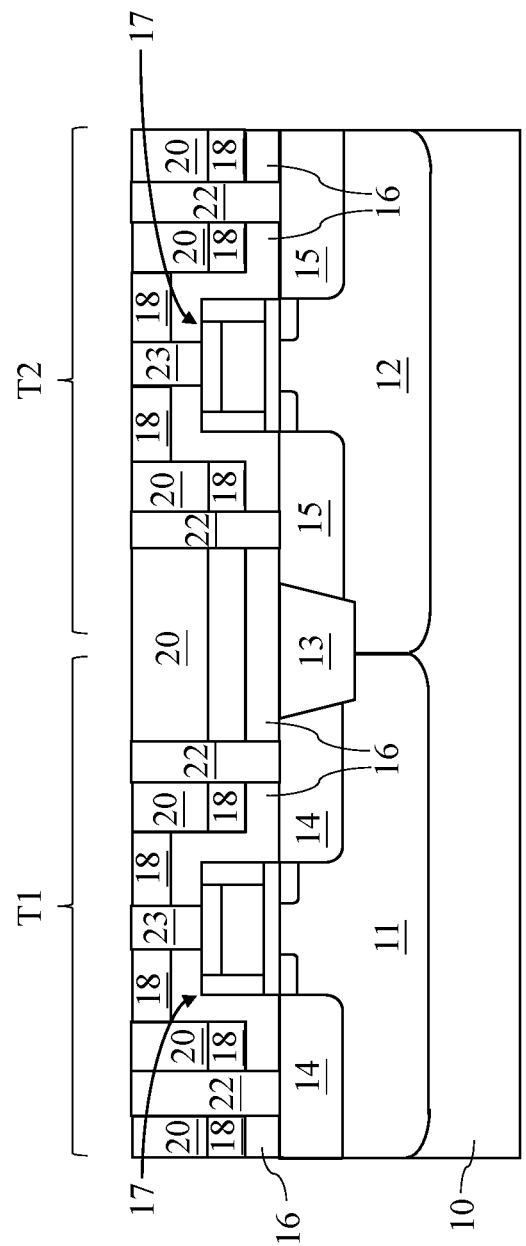

Afterwards, a lithography process can be performed successively to etch parts of the first SiN layer 19, parts of the first silicate glass layer 18, and parts of the inter-layer dielectric layer 16 that are formed on the first terminals 17, so as to form the second openings H2 on the first terminals 17 in step S180. Next, in step S182, another layer of TiN (not shown) and a layer of electrode metal layer 23 (including tungsten, cobalt or ruthenium) is deposited so as to fill the second openings H2 on the first terminals 17 as shown in FIG. 2C. Finally, in step S190, the SiN layers 19 and 21 are removed by DRIE, and thus, the unwanted parts of TiN (not shown) and the second electrode metal layer 23 can be removed as well. As a result, the input/output electrodes of the transistors T1 and T2 can be formed with their surfaces substantially coplanar with surfaces of the silicate glass layers 18 and 20 as shown in FIG. 2D. That is, the method M1 allows to form an even surface in the FEOL by utilizing a lift-off process for materials formed in high temperatures to reduce the usage of CMP processes. In some embodiments, the conductive line 104 in FIG. 1 is an input/output electrode of a transistor, and the method M1 can be adopted to form the conductive line 104 on the wafer 102 with an even surface. However, the present disclosure is not limited thereto.

Note that one can fill the electrodes (i.e., tungsten plugs) aforementioned in another way of embodiment. Let the electrodes, including tungsten, cobalt or ruthenium, on the sources and drains have thicknesses larger than the thicknesses of the electrodes on the gates by a thickness difference $\Delta T_1$, then one can fill the electrodes on the gate, source and drain (in some embodiments, a barrier layer of TiN may also be filled before depositing the tungsten) at the same time with the same thicknesses at first. Then a first lift-off process for materials formed in high temperatures can be performed to form the electrodes on the gates. In this case, parts of the electrodes on the sources and drains are also formed. Afterward, another photoresist layer (not shown) is applied to cover the gates and to form openings H1 on the sources and drains. Next, the rest parts of the electrodes on the sources and drains can be filled in the openings by a thickness equal to the thickness difference $\Delta T_1$ (in this embodiment, a barrier layer of TiN may not be filled before depositing the electrodes, because they are already existing at the side-walls of openings H1 on the source and drain). Finally, a second lift-off process for materials formed in high temperatures can be performed successively to form the rest parts of the electrodes on the source and drain. As a result, the electrodes can be formed on the sources and drains having the thicknesses larger than the thicknesses of the electrodes on the gates by the thickness difference $\Delta T_1$. In some embodiments, such processes can be repeated for r times (e. g., r is an integer greater than 1) so as to form electrodes with r different thicknesses. That is, the electrodes can be preferably formed according to the order of their thicknesses, and the thinnest electrodes should be formed first, while the thickest electrodes should be formed last, thereby improving the efficiency of the manufacturing process in r times only.

Figure 3:
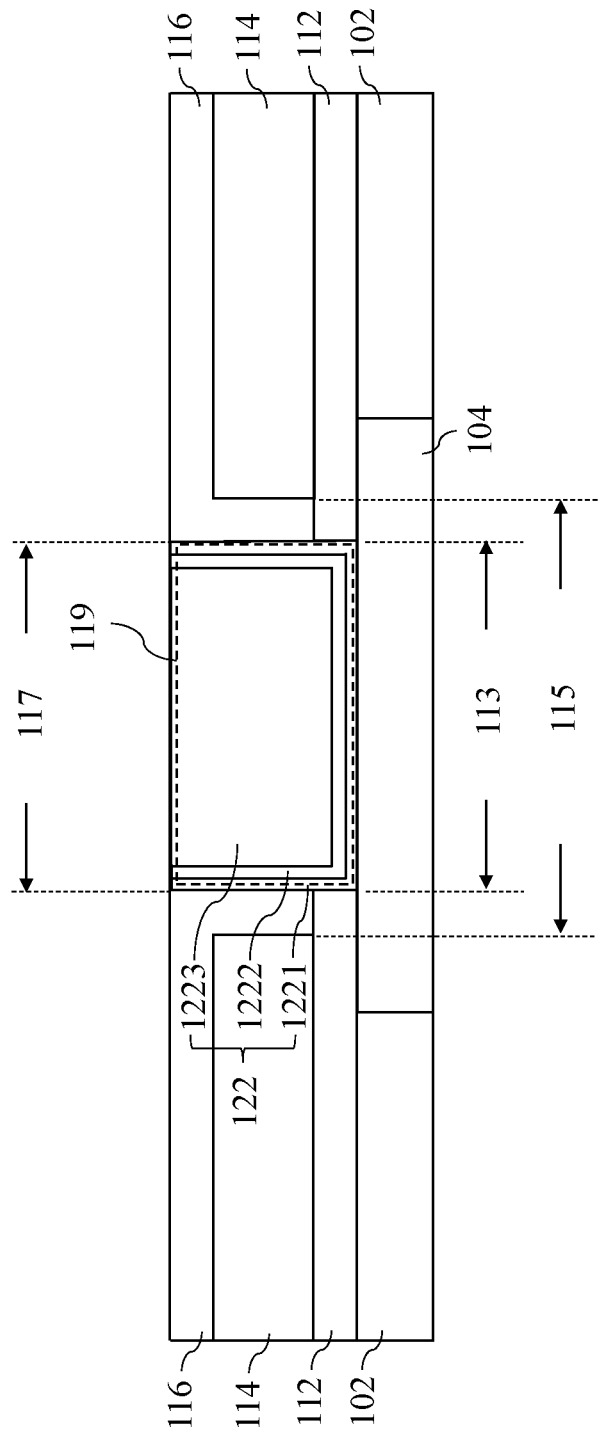
FIG. 3 is a cross-sectional diagram showing the manufacturing of the interconnect base of the semiconductor structure in FIG. 1.

After the conductive line 104 (e.g., tungsten plug) is formed in the wafer 102 with the surfaces of the conductive line 104 and the wafer 102 satisfying the requirement of DoF, the interconnect 120 including the interconnect base 122 and the interconnect body 124 (e.g., copper) as shown in FIGS. 1 and 3 can also be formed by another lift-off process so as to reduce the usage of costly CMP processes.

In the present embodiment, before forming the interconnect body 124, the inter-layer dielectric layer 110 can be formed firstly. The inter-layer dielectric layer 110 includes a first insulating layer 112, a dielectric layer 114, and a second insulating layer 116. The insulating layer 112 is formed on the wafer 102, and the dielectric layer 114 is formed on the first insulating layer 112 while leaving at least one part of the insulating layer 112 uncovered. The second insulating layer 116 is formed on the dielectric layer 114 and the first insulating layer 112, and the second insulating layer 116 may cover sidewalls of the dielectric layer 114.

In some embodiments, the first and the second insulating layers 112 and 116 may include a same material, such as silicon oxynitride (SiO$_x$N$_y$), and the dielectric layer 114 may, for example but not limited to, include low-k material that has a dielectric constant less than those dielectric constants of the first and the second insulating layers 112 and 116. For example, a dielectric constant of silicon oxynitride is greater than 3, and a dielectric constant of the dielectric layer 114 is less than 2.5. The dielectric layer 114 may include methylsilsesquioxane (MSQ), fluorocarbon silsesquioxane (FSQ), and/or other suitable materials. In some embodiments, since the low-k dielectric materials may be low hardness materials, the second insulating layer 116 may surround the dielectric layer 114 so as to provide structural support to the dielectric layer 114.

Below, a modified Damascene method M2 of manufacturing the interconnect base 122 according to one embodiment of the present disclosure is introduced in detail. FIG. 3 shows a cross-sectional diagram showing the manufacturing of the interconnect base 122 according to the method M2. The method M2 includes steps S210 to S240 as follows.

S210: Form a first insulating layer 112.

S220: Form a dielectric layer 114 on the first insulating layer 112 while having at least one part of the first insulating layer 112 uncovered.

S230: Form a second insulating layer 116 on the dielectric layer 114 and the first insulating layer 112.

S240: Form the interconnect base 122 in the first insulating layer 112 and the second insulating layer 116.

A briefing of Method M2 is as follows. In some embodiments, the method M2 can be adopted to manufacture the semiconductor structure 100.

In step S210, the first insulating layer 112 is formed on the conductive line 104. In the present embodiment, the first insulating layer 112 may be patterned to form an opening 113 by performing a lithography process so that at least one part of the conductive line 104 is exposed.

Next, in step S220, the dielectric layer 114 is formed on the first insulating layer 112. In the present embodiment, the dielectric layer 114 may be patterned to form an opening 115 by performing a lithography process so that at least one part of the first insulating layer 112 and the at least one part of the conductive line 104 can be exposed. The opening 115 formed in the dielectric layer 114 is projectively over the opening 113 previously formed in the first insulating layer 112. In some embodiments, the dielectric layer 114 may be thicker than the first insulating layer 112. For example, but not limited thereto, a thickness of the first insulating layer 112 may between 100 nm and 150 nm, and a thickness of the dielectric layer 114 may be between 200 nm and 400 nm.

In step S230, the second insulating layer 116 is formed on the dielectric layer 114 and the first insulating layer 112. In the present embodiment, the second insulating layer 116 may be patterned to form an opening 117 by performing a lithography process so that the at least one part of the conductive line 104 to be coupled to the interconnect base 122 is exposed. The opening 117 is located at a base region 119 (e.g., the region remarked by the dotted line in FIG. 4A) of the second insulating layer 116 over the portion of the conductive line 104. In some embodiments, the opening 113 formed in the first insulating layer 112 is entirely included in the opening 117. Also, as shown in FIG. 3, since the second insulating layer 116 surrounds the dielectric layer 114 and covers the sidewalls of the dielectric layer 114, the second insulating layer 116 can provide structural support for the dielectric layer 114, thereby maintaining structural stability of the semiconductor structure 100.

In some embodiments, the first and second insulating layers 112 and 116 may comprise silicon oxynitride. In such case, since the formation of the silicon oxynitride may require a depositing temperature, e.g., up to about 350° C., the dielectric layer 114 may include materials that can endure temperatures over about 350° C. so as to ensure stability of the dielectric layer 114 during the formation of the second insulating layer 116.

Figure 4A:
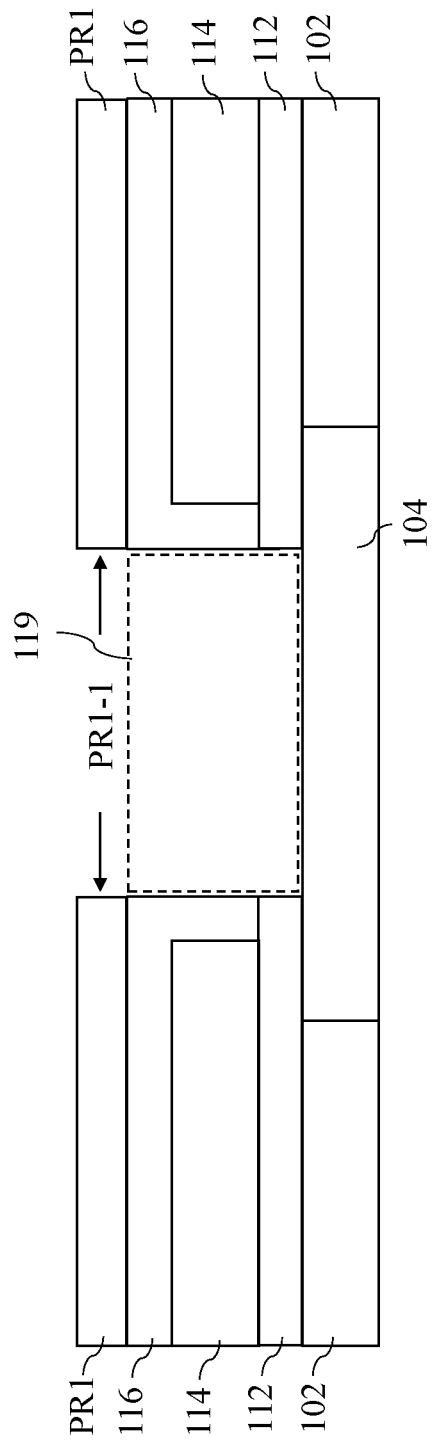
FIGS. 4A to 4B are cross-sectional diagrams showing the manufacturing process of an interconnect base according to one embodiment.
Figure 4B:
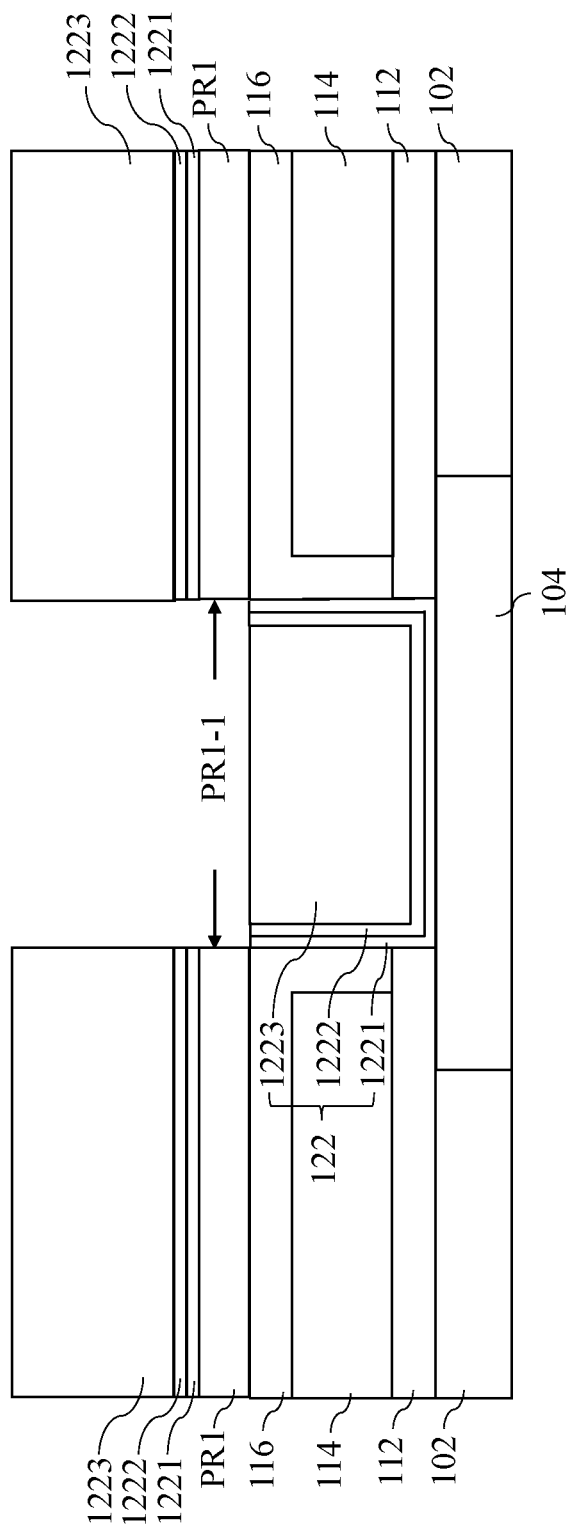

In some embodiments, after the second insulating layer 116 is formed in step S230, the interconnect base 122 is formed in the base region 119 of the first and second insulating layers 112 and 116 by filling the opening 117, as shown in FIG. 3. In the present embodiment, step S240 for forming the interconnect base 122 can be performed to reduce the usages of CMP processes. According to one embodiment of the present disclosure, the step S240 may include sub-steps S241 to S245 (Method M3) as follows. FIGS. 4A to 4B are cross-sectional diagrams showing a manufacturing process of the interconnect base 122 according to the sub-steps S241 to S245.

S241: Pattern a photoresist layer PR1 on the second insulating layer 116 while leaving the base region 119 in the first insulating layer 112 and the second insulating layer 116 uncovered.

S242: Form a barrier layer 1221 on the layer of photoresist PR1 and in the base region 119.

S243: Form a copper-phosphorous alloy layer 1222 on the barrier layer 1221.

S244: Plate a copper layer 1223 on the copper-phosphorous alloy layer 1222 to fill the base region 119.

S245: Remove the photoresist layer PR1 along with a part of the barrier layer 1221, a part of the copper-phosphorus alloy layer 1222, and a part of copper layer 1223 that are stacked on the photoresist layer PR1.

A briefing of Method M3 is as follows. In step S241, as shown in FIG. 4A a layer of photoresist PR1 is applied on the second insulating layer 116 and is patterned to form an opening PR1-1 without covering the base region 119. In the present embodiment, the photoresist layer PR1 is patterned with a mask same as that used to pattern the second insulating layer 116. Therefore, a width of the opening PR1-1 shown in FIG. 4A is same as a width of the opening 113 of the first insulating layer 112 and a width of the opening 117 of the second insulating layer 116 shown in FIG. 3. In such case, since the mask used for patterning the opening 113 of the insulating layers 112 and 116 can be reused to pattern the opening PR1-1 of the photoresist layer PR1, a cost of producing a new mask can be saved.

After the opening PR1-1 of the photoresist layer PR1 is formed, at least one conductive material can be applied over the wafer including the photoresist layer PR1 for forming the interconnect base 122. In the present embodiments, the following three types of conductive materials are used. In step S242, as shown in FIG. 4B a first conductive layer of barrier material 1221 is formed on the photoresist layer PR1 and over the base region 119 (in FIG. 3) of the first and second insulating layers 112 and 116. In such case, the barrier material 1221 is in contact with a side of the first insulating layer 112 and a side of the second insulating layer 116, and also in contact with the conductive line 104. In the present embodiment, the barrier material 1221 may, for example but not limited thereto, include titanium nitride (TiN).

In step S243, a second conductive copper-phosphorous alloy layer 1222 is formed on the barrier layer 1221 as shown in FIG. 4B. In the present embodiment, the copper-phosphorous alloy layer 1222 can be deemed as a wetting layer for depositing copper in the subsequent step. In addition, the copper-phosphorous alloy layer 1222 is formed by performing an electroless-plating process. Due to a good wettability of the copper-phosphorous alloy layer 1222, the copper-phosphorous alloy layer 1222 is formed as a good adhesive film covering the barrier layer 1221. In addition, to prevent the barrier material 1221 and the copper-phosphorous alloy layer 1222 from attaching to sidewalls of the photoresist layer PR1, suitable additive in the plating solution, such as a quencher or inhibitor, may be adopted.

After the copper-phosphorous alloy layer 1222 is formed, a third conductive copper layer 1223 is plated on the copper-phosphorous alloy layer 1222 to fill the base region 119 in step S244 as shown in FIG. 3. Subsequently, in step S245, the photoresist layer PR1 and portions of the barrier layer 1221, the copper-phosphorous alloy layer 1222, and the copper layer 1223 that are over the photoresist layer PR1 are removed. Consequently, as shown in FIG. 3, the interconnect base 122 in the semiconductor structure 100 can be formed through such lift-off operation.

Accordingly, by using the previous modified Damascene method M2 and controlling the thickness of the plating materials properly, the number of the CMP processes required can be significantly reduced. In some embodiments, the copper plating thickness may be controlled by AI learning and monitoring methods. As a result, the usage of CMP processes can be reduced, and thus, the resources (e.g., water, slurry, electricity, manpower, conductive materials, etc.) and the extra design of dummy loads required by CMP process can be saved. Therefore, both the cost and the yield of the semiconductor structure can be optimized, which is in line with ESG (environmental, social, and governance) spirit.

In some embodiments, to ensure that the unwanted portions of the barrier layer 1221, the copper-phosphorous alloy layer 1222, and the copper layer 1223 that are over the photoresist layer PR1 can be removed without damaging the desired portions of the barrier layer 1221, the copper-phosphorous alloy layer 1222, and the copper layer 1223 that are formed within the base region, the photoresist layer PR1 may be negative photoresist. Since the negative photoresist will become insoluble in the photoresist developer after being exposed, the opening of the photoresist layer PR1 can have an undercut shape (not shown), which can reduce the connection between the unwanted portions, such as the barrier layer 1221, the copper-phosphorous alloy layer 1222, and the copper layer 1223 on the photoresist layer PR1, and the wanted portions, such as the copper layer 1223 in the base region 119. This is because that the undercut shape of the opening PR1-1 can keep the copper layer 1223 from attaching on the sidewalls of the photoresist layer PR1 during the platting process.

Furthermore, in some embodiments, to further reduce connection between the unwanted portions and the wanted portion of the platted metal, two photoresist layers may be adopted. For example, after the photoresist layer PR1 is applied and patterned to have an opening PR1-1, an additional photoresist layer may be applied and patterned to have an opening. The additional photoresist layer may include negative photoresist material that is different from the material adopted by the photoresist layer PR1. In such case, after the additional photoresist layer is patterned, the photoresist developer of the photoresist layer PR1 can be applied to further etch the photoresist layer PR1 and broaden the opening PR1-1. Since the additional photoresist is exclusively insoluble in the photoresist developer of the photoresist layer PR1, the width of the opening of the additional photoresist will not be changed. As a result, a greater undercut structure in the lower layer can be formed by applying the two photoresist layers, and the lift-off operation with thicker layers of photoresist for forming a thicker layer of copper can be performed even more smoothly. In some embodiments, the copper layer 1223 may be replaced by a cobalt layer, a ruthenium layer or an alloy layer comprising at least one of the aforementioned metal materials. A more detail structure can be seen in FIG. 5, and the relevant description will be provided below.

In the present embodiment, the interconnect base 122 is formed in the semiconductor structure 100 for providing the vertical electronic connection between conductive lines in metal layers of two different levels. In such case, the interconnect base 122 can be seen as a conductive via, and the interconnect body 124 can be a part of the conductive line of the metal layer 130. However, the present disclosure is not limited thereto. In some embodiments, the interconnect base 122 is not necessary a via coupling between conductive lines of different metal layers; alternatively, the interconnect base 122 may be also applied to make passive devices of 3D MMICs with some advantages. For example, compared to conventional MMICs that are usually formed on an interposer (e.g., PI) or a PCB, the methods and the semiconductor structures provided by the embodiments of the present disclosure allow the designer to make 3D MMICs with better performances to acquire a smaller form factor and a higher accuracy (such as bandwidth and gain) as well as yields by utilizing semiconductor manufacturing processes for forming the interconnect base 122.

Specifically, the method for forming the interconnect base 122 of the present disclosure is flexible and can be adopted to integrate passive devices of multi-layer 3D MMICs. For instance, the interconnect base 122 can be adopted as a part of a waveguide, a band pass filter, a band stop filter, a resonator with parasitic L and C in parallel or in series, a π-type or a T-type impedance matching filter. Furthermore, by using the modified Damascene method that is capable of reducing the use of CMP process, these embedded passive devices of 3D MMICs can be formed in a low-cost manner. Moreover, since these embedded passive devices can be perpendicular to the other planar devices in the semiconductor structure, the majority currents of the passive devices of 3D MMICs formed in the interconnect base 122 would flow along the vertical direction, and thus, the electromagnetic fields generated by these 3D MMICs can be perpendicular to those electromagnetic fields generated by the planar semiconductor devices, thereby significantly reducing the mutual interferences among the circuits.

Furthermore, compared to a traditional copper via, the interconnect base 122 adopted for making 3D MMICs may have a larger form factor. For example, the interconnect base 122 may have a diameter in a range from 1 μm to 500 μm and a thickness in a range from 10 μm to 400 μm, while the traditional copper via on the same wafer may have a diameter in a range from 10 nm to 100 nm and a thickness in a range from 10 nm to 1 μm.

After the interconnect base 122 is formed, the metal layer 130 and the dielectric layer 140 for insulation as shown in FIG. 1 can be formed thereon. In the present embodiment, since the copper plating (including electro-plating and electroless-plating) process allows accurate thickness control, for example, by AI learning and monitoring methods, the thickness of the copper layer 1223 can be controlled to be substantially same as a depth of the base region 119. Therefore, the surface of the interconnect body 124 and the surface of the insulating layer 116 can be substantially coplanar, and thus, the dielectric layer 140 can be formed over the interconnect body 124 and the surface of the insulating layer 116 can be patterned properly.

After the dielectric layer 140 is patterned, the metal layer 130 can be formed. In the present embodiment, the metal layer 130 includes the interconnect body 124 and conductive traces 132 and 134. The interconnect body 124 is disposed on the interconnect base 122, and the conductive traces 132 and 134 are disposed on the insulating layer 116. In some embodiments, the conductive traces 132 and 134 may be parts of other conductive lines in the metal layer 130.

In the present embodiment, the metal layer 130 can be formed by a method similar to the one for forming the interconnect base 122 aforementioned (i.e., a lift-off process). That is, the metal layer 130 may be deposited to fill openings of the dielectric layer 140 to form desired lines and to reduce the usage of CMP processes, thereby simplifying a semiconductor manufacturing process and reducing the resources (e.g., water, slurry, electricity, manpower, conductive materials, etc.), the extra design of dummy loads, dish effects, reliability issues, time as well as cost. Thus, in some embodiments of the present disclosure, the formation of the interconnect base 122 and the interconnect body 124 are both based on modified Damascene methods that can reduce the use of the CMP processes.

Furthermore, in some embodiments, the conductive traces 132, 134 and the interconnect body 124 can have various thicknesses and even greater than those of conductive traces formed by a conventional method. While the CMP method may be limited by the degraded adherence between the layers of copper and low-k dielectric material for a long time, the modified Damascene method and lift-off process can be applied for plating a thicker copper layer, such that the resistance of the conductive traces 132, 134 and the interconnect body 124 can be reduced. In some embodiments, such conductive traces 132 and 134 with thicker copper layers and lower resistance can be very useful for forming not only outer regions of chips but high-power devices.

In addition, in the present embodiment, since the thicknesses of the interconnect body 124 and the conductive traces 132 and 134 are the same, the interconnect body 124 and the conductive traces 132 and 134 can all be formed by one copper plating process and one lift off process. However, in some other embodiments, the conductive traces 132, 134 and the interconnect body 124 in the metal layer 130 are allowed to have different thicknesses. For example, if the conductive trace 132 is adopted for higher power transmission, then the conductive trace 132 may have a thickness larger than thicknesses of the general conductive trace 134 and the interconnect body 124 (the thicknesses of 124 and 134 are equal) by a thickness difference $\Delta T_2$, so that the conductive trace 132 can have lower resistance, thereby increasing the power transmission efficiency. In such case, a copper layer can be plated for forming the conductive trace 134 (in some embodiments, a barrier layer and a copper-phosphorous alloy layer may also be plated with the copper layer), the interconnect body 124, and a first part of the conductive trace 132 in the metal layer 130 with same thicknesses. Then a first lift-off process can be performed to form the conductive trace 134 and the interconnect body 124, and the first part of the conductive trace 132 for higher power transmission. Afterward, another photoresist layer is applied to cover the conductive trace 134 and the interconnect body 124 while an opening on the first part of the conductive trace 132 is formed. Next, another copper layer can be plated in the opening of the photoresist (i.e., on the conductive trace 132) and on the photoresist layer by a thickness equal to the thickness difference $\Delta T_2$ (in some embodiments, a barrier layer and a copper-phosphorous alloy layer may also be plated with the copper layer). Finally, a second lift-off process can be performed successively to form the second part of the conductive trace 132. As a result, the conductive trace 132 for higher power transmission having the thickness larger than the thickness of the conductive trace 134 or the interconnect body 124 by thickness difference $\Delta T_2$ can be formed.

In some embodiments, such processes can be repeated multiple times so as to form conductive traces and/or interconnect bodies with multiple different thicknesses. That is, when there are conductive traces and/or interconnect bodies that have q (an integer greater than 1) different thicknesses, the conductive traces and/or interconnect bodies can be formed according to the order of their thicknesses, and the thinnest conductive traces and/or interconnect bodies should be formed first, while the thickest conductive traces and/or interconnect bodies should be formed last, thereby improving the efficiency of the manufacturing process in q times only.

Similarly, interconnect bases 122 may also be formed with different thicknesses. For example, if there are interconnect bases 122 having p (an integer greater than 1) different thicknesses, one can apply the method given in the previous paragraph that includes metal plating process and lift-off process to form the interconnect bases from the one having the smallest thickness to the one having the largest thickness in p times.

Below, some more embodiments of the present disclosure are presented to introduce other possible manufacturing methods and structures of the metal layers.

Figure 5:
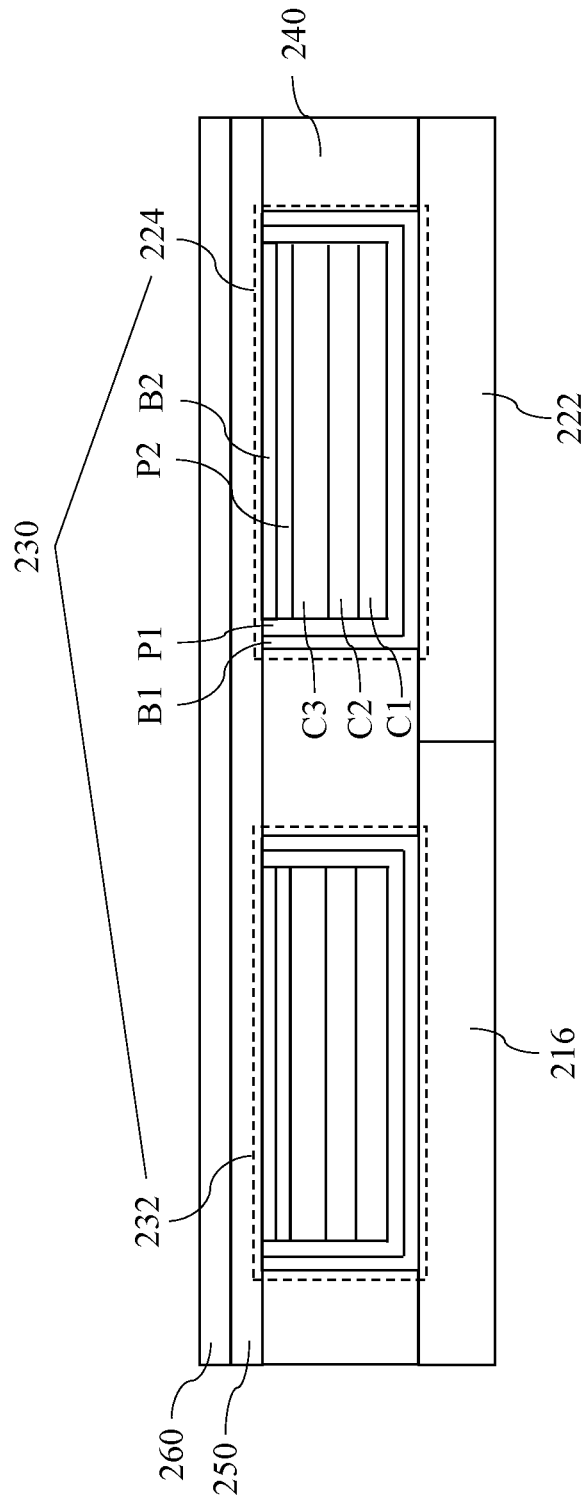
FIG. 5 shows a cross-sectional diagram of a metal layer according to one embodiment of the present disclosure.

FIG. 5 is a cross-sectional diagram of a metal layer 230 according to one embodiment of the present disclosure. The metal layer 230 includes a conductive trace 232 disposed over the second insulating layer 216 and an interconnect body 224 disposed over the interconnect base 222. As shown in FIG. 5, the conductive trace 232 and the interconnect body 224 can be isolated from each other by a dielectric layer 240. In some embodiments, similar to the dielectric layer 140, the dielectric layer 240 can include a material having a low-k constant. In the present embodiments, the conductive trace 232 and the interconnect body 224 can be formed by processes similar to those adopted to form the interconnect base 122 aforementioned, and the processes used for forming the metal layer 230 are also similar to those adopted to form the metal layer 130. For example, after the insulating layer 216 is formed, a photoresist layer can be patterned thereon, and then, a barrier layer B1, a copper-phosphorous alloy P1, and a copper layer C1 can be formed successively.

Afterwards, the unwanted part of the barrier layer B1, the copper-phosphorous alloy P1, and the copper layer C1 can be removed along with the photoresist layer by a lift-off process. In one embodiment of the present disclosure, to ensure that unwanted copper left on the photoresist layer can be removed along with the photoresist layer, instead of plating the copper layer C1 with a large thickness to fill the openings of the insulating layer 216 all at once, several plating processes are performed with thickness measurement and monitoring by AI learning techniques. As shown in FIG. 5, the copper layers C1, C2, and C3 can be formed by three plating processes respectively, and each of the copper layers C1, C2, and C3 may have a thickness approximately equal to one-third of a thickness of the dielectric layer 240. However, the present disclosure is not limited thereto. In some embodiments, the interconnect body 224 or the conductive trace 232 may include only one copper layer or other numbers of copper layers according to the needs. That is, in some embodiments, the opening of the insulating layer 216 may be filled by the barrier layer B1, the copper-phosphorous alloy P1, and the copper layer C1 without further platting the copper layers C2 and C3.

After the opening of the insulating layer 216 is filled (either by one copper layer C1 with a full thickness that can fill the openings of the insulating layer 216 all at once, or by multiple copper layers, such as C1, C2, and C3 successively, which is adopted in the following illustration), before forming a third insulating layer 250, another copper-phosphorous alloy layer P2 and another barrier layer B2 are sequentially formed. In such case, the copper-phosphorous alloy layers P1 and P2 are sandwiched by the copper layers C1, C2, and C3 and the barrier layers B1 and B2, and the copper layers C1, C2, and C3 are confined within the lower and upper layers of barrier layers B1 and B2. The copper-phosphorous alloy layer P2 on top of the copper layers C1, C2, and C3 can protect the copper layers C1, C2, and C3 from oxidized. In some embodiments, the copper layers C1, C2, and C3 may be replaced by cobalt layers, ruthenium layers or alloy layers comprising at least one of the aforementioned metal materials. In some embodiments, if the fabrication process is not well developed yet, an off-line measurement may be performed each time after a copper layer C1, C2, or C3 is plated. In such case, each time when a copper layer C1, C2, or C3 is plated, a layer of copper-phosphorous alloy may be formed thereon so as to protect the copper layer C1, C2, or C3. However, the present disclosure is not limited thereto.

Furthermore, in the present embodiment, if the metal layer 230 is a top metal layer, a polyimide layer 260 may be further formed on the third insulating layer 250 so as to form a flat top surface (the structures of the upper and lower parts for connecting to the external circuits are not shown in FIG. 5). However, the present disclosure is not limited thereto.

In some embodiments, conductive traces in semiconductor structures may be used for high frequency signal transmission. In such embodiments, a skin effect may become significant, causing low signal transmission efficiency. In the present disclosure, to improve the signal transmission efficiency, low-k dielectric bodies may be formed in the conductive trace and/or an interconnect body so as to increase a total surface area of the trace and the interconnect body, thereby increasing the signal transmission efficiency as follows.

Figure 6:
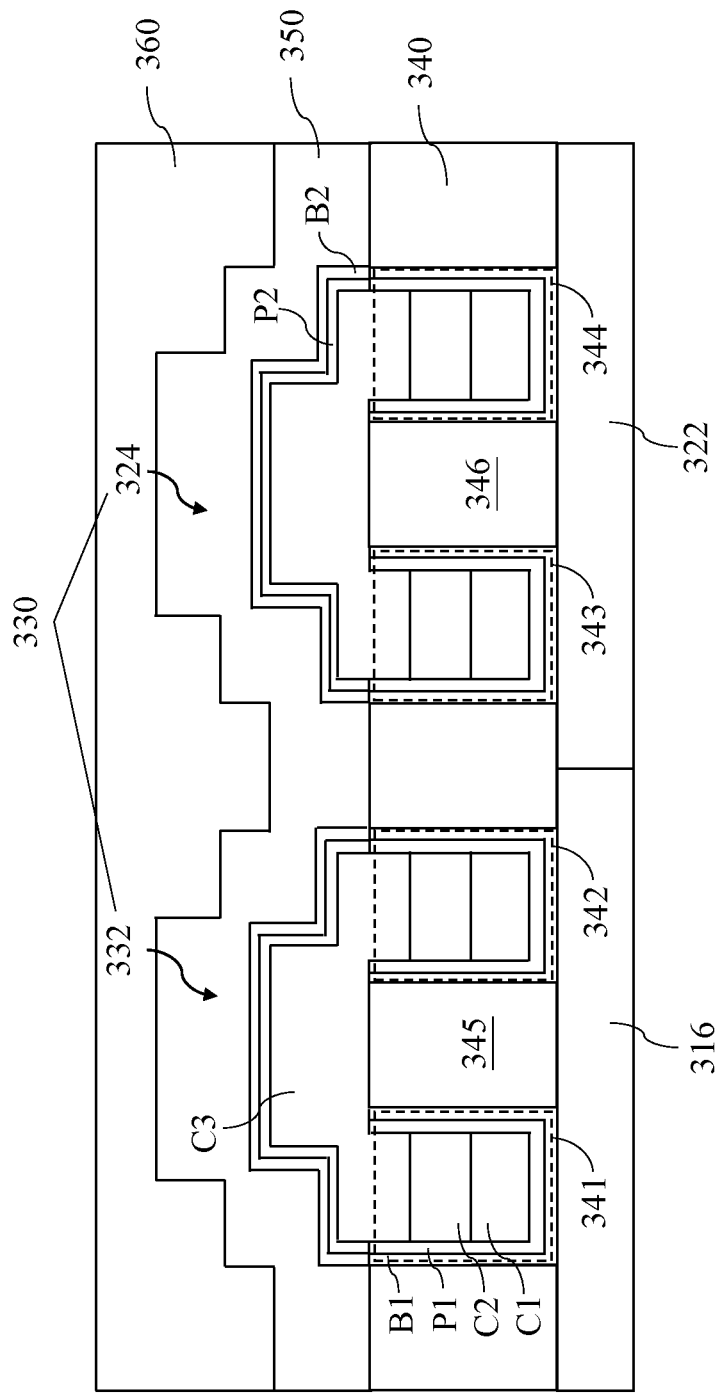
FIG. 6 shows a cross-sectional diagram of a metal layer according to another embodiment of the present disclosure.

FIG. 6 is a cross-sectional diagram of a metal layer 330 according to one embodiment of the present disclosure. In some embodiments, the metal layer 330 may be adopted for replacing the metal layer 130. In some embodiments, as shown in FIG. 6, a dielectric layer 340 is formed on a second insulating layer 316 and an interconnect base 322. In the present embodiment, the dielectric layer 340 is patterned to form multiple openings 341, 342, 343 and 344, and a dielectric body 345 is left between the openings 341 and 342, and a dielectric body 346 is left between the openings 343 and 344. In some embodiments, the dielectric layer 340, and the dielectric bodies 345 and 346 can include dielectric materials that have low dielectric constants (i.e., low-k materials).

As shown in FIG. 6, after the dielectric layer 340 is patterned, a barrier layer B1, a copper-phosphorous alloy layer P1, and a copper layer C1 can be formed in the openings 341, 342, 343 and 344 of the dielectric layer 340 by performing processes similar to those previously illustrated. Similarly, another copper layer C2 is plated on the copper layer C1.

Furthermore, as shown in FIG. 6, another copper layer C3 is deposited over the copper layer C2 and the dielectric bodies 345 and 346. Next, a copper-phosphorous alloy layer P2 and a barrier layer B2 are sequentially formed on the copper layer C3, so that the copper layers C1, C2, and C3 are confined within the barrier layers B1 and B2. As a result, the conductive trace 332 and the interconnect body 324 of the metal layer 330 are formed. In the present embodiment, as the dielectric body 345 is formed within the conductive trace 332 and the dielectric body 346 is formed within the interconnect body 324, a surface area of the conductive trace 332 and a surface area of the interconnect body 324 are increased. As a result, the reduction of the signal transmission efficiency caused by the skin effect can be mitigated.

In some embodiments, as shown in FIG. 6, a third insulating layer 350 is formed on the metal layer 330. In addition, if the metal layer 330 is a top metal layer, that is, if no further metal layer is to be formed over the metal layer 330, then a polyimide layer 360 may be formed on the third insulating layer 350 so as to obtain a flat top surface. (The structures of the upper and lower parts for connecting to the external circuits are not shown in FIG. 6)

As shown in FIG. 6 the dielectric bodies 345 and 346 are formed from a bottom of the metal layer 330. However, the present disclosure is not limited thereto. In some other embodiments, the dielectric bodies can be buried within the metal layer 330.

Figure 7:
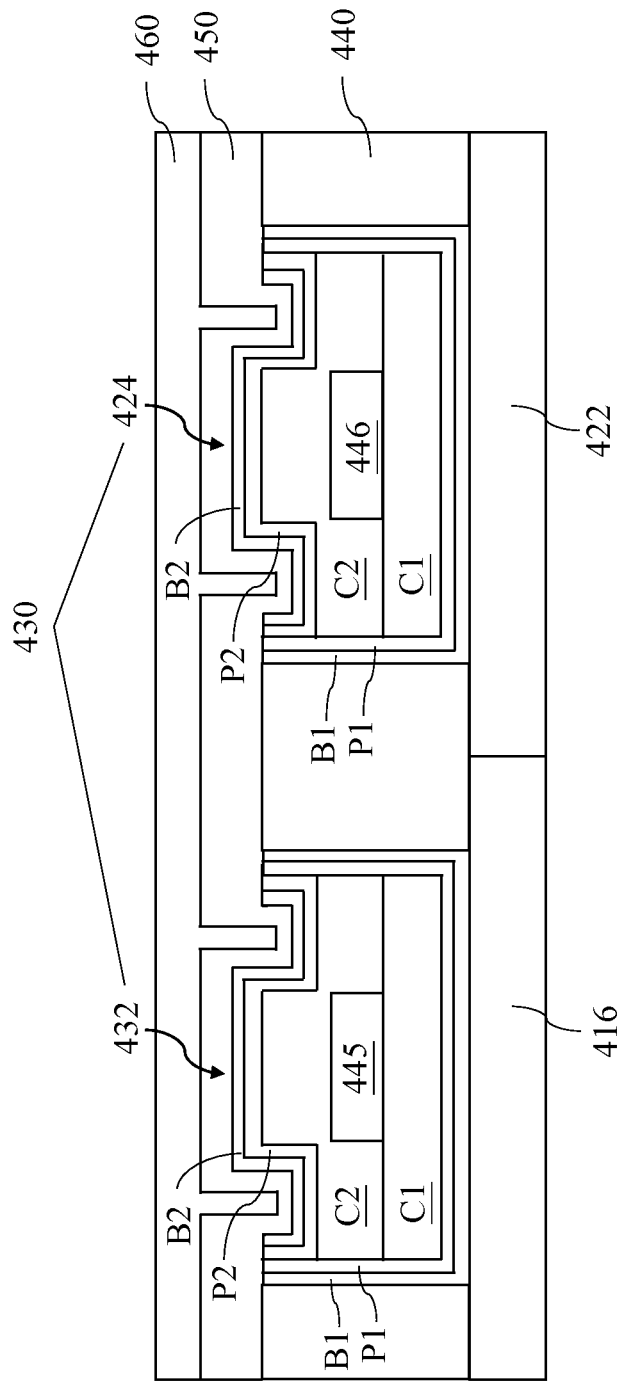
FIG. 7 shows a cross-sectional diagram of a metal layer with increased conduction area according to another embodiment of the present disclosure.

FIG. 7 is a cross-sectional diagram showing a metal layer 430 with increased conduction surface area according to one embodiment of the present disclosure. As shown in FIG. 7, a dielectric layer 440 can be formed on a second insulating layer 416 and an interconnect base 422. In the present embodiment, the dielectric layer 440 is patterned to form two openings over both the second insulating layer 416 for forming a conductive trace 432 of the left MMIC, and the interconnect base 422 for forming an interconnect body 424 of the right MMIC.

In some embodiments, as shown in FIG. 7, a barrier layer B1 and a copper-phosphorous alloy layer P1, and a copper layer C1 can be formed in the openings of the dielectric layer 440 to fabricate conductive traces 432 and interconnect body 424 by performing processes similar to those previously illustrated.

Next, two dielectric bodies 445 and 446 are formed on the copper layer C1 by using photolithography process. Furthermore, a copper layer C2 is then plated on the copper layer C1 and the dielectric bodies 445 and 446. As a result, the dielectric bodies 445 and 446 are buried within the copper layers C1 and C2 in the conductive trace 432 and the interconnect body 424.

Furthermore, as shown in FIG. 7, a copper-phosphorous alloy layer P2 and a barrier layer B2 can be formed on the copper layer C2, and a third insulating layer 450 can be formed on the metal layer 430. In addition, if the metal layer 430 is the top metal layer (that is, if no further metal layer is to be formed over the metal layer 430), then a polyimide layer 460 (or the likes) is formed on the third insulating layer 450 so as to obtain a flat top surface. In some embodiments, with the flat polyimide layer 460, a coplanar waveguide of 3D MMIC (not shown) can be formed thereon. (The structures of the upper and lower parts for connecting to the external circuits are not shown in FIG. 7).

In the embodiments as shown in FIG. 7, in each of the conductive trace 432 and the interconnect body 424, either a dielectric body 445 or 446 is buried; however, the present embodiment is not limited thereto. In some embodiments, not only can more layers of copper metal be formed, but more dielectric bodies can be buried so as to further increase surface areas of the conductive trace 432 and the interconnect body 424.

Figure 8:
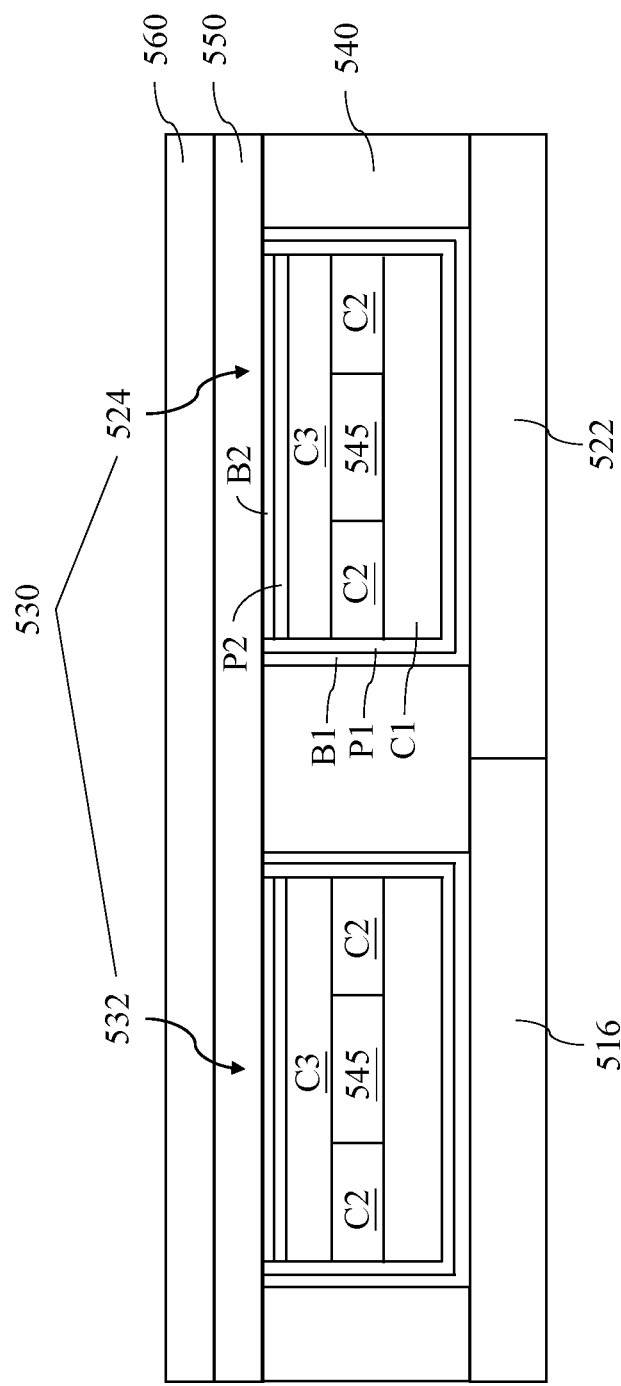
FIG. 8 shows a cross-sectional diagram of a metal layer with increased conduction area according to another embodiment of the present disclosure.

FIG. 8 shows a cross-sectional diagram of a metal layer 530 with increased conductive surface area according to another embodiment of the present disclosure. As shown in FIG. 8, a dielectric layer 540 can be formed on a second insulating layer 516 and an interconnect base 522. In the present embodiment, the dielectric layer 540 is patterned to form two openings over both the second insulating layer 516 for forming a conductive trace 532 of the left MMIC, and the interconnect base 522 for forming an interconnect body 524 of the right MMIC.

In each of the conductive trace 532 and the interconnect body 524, at least one dielectric body 545 is buried. In addition, by controlling the thickness of copper deposition, the copper layer C2 can be formed on the copper layer C1 without covering the dielectric bodies 545. In addition, the surfaces of the copper layer C2 and the surfaces of the dielectric bodies 545 can be substantially coplanar. In such case, the copper layer C3 can be formed on the copper layer C2 and the dielectric bodies 545. Also, on top of the copper layer C3, another barrier layer B2 and another copper-phosphorous alloy layer P2 can be formed. As a result, a flat layer of third insulating layer 550 and a polyimide layer 560 can be formed as shown in FIG. 8. (The structures of the upper and lower parts for connecting to the external circuits are not shown in FIG. 8).

In the embodiments shown in FIGS. 7 and 8, by inserting dielectric bodies within the conductive lines (e.g., the conductive traces 432, 532 and the interconnect body 424, 524), the surface area can be increased, which makes such conductive lines especially suitable for high frequency applications. On the other hand, by properly designing the dimensions, both circuits in FIGS. 7 and 8 can be applied to form filters, such as a low pass, band pass, high pass and notch filters.

Although an efficiency of high-frequency signal transmission can be improved by increasing surface areas of transmission lines as mentioned above, interference between different high-frequency signal transmissions, that is, electromagnetic interference (EMI), may still be an issue since distances between transmission lines has become shorter as die sizes become smaller.

Figure 9:
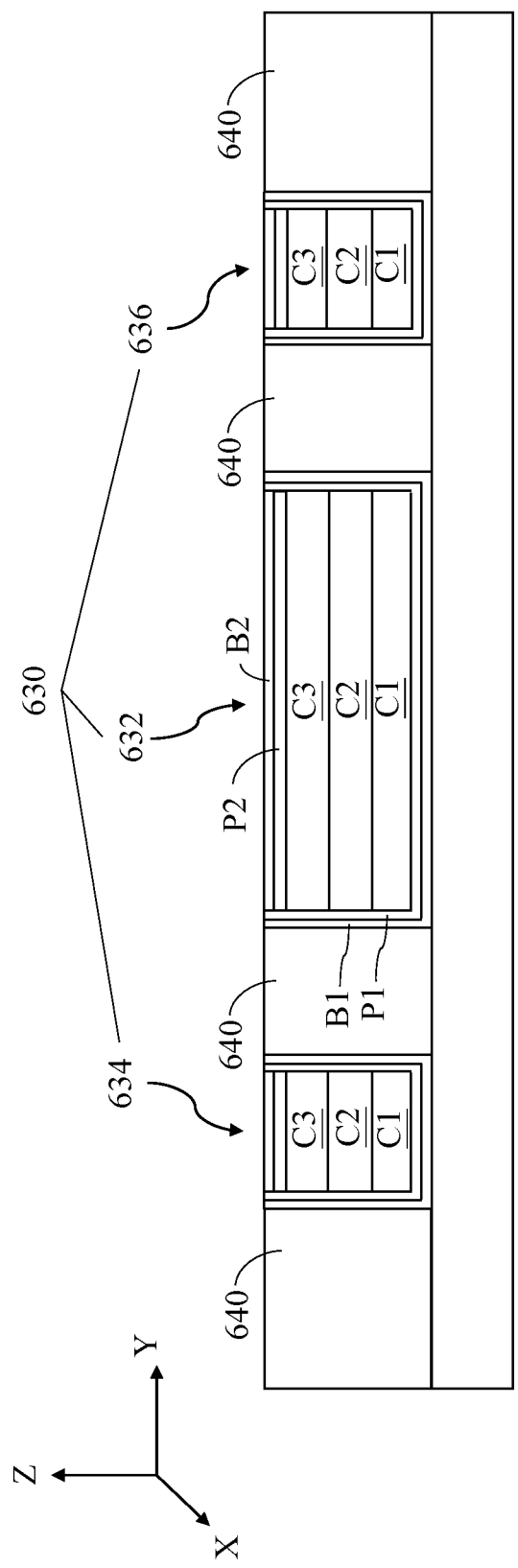
FIG. 9 shows a cross-sectional diagram of a metal layer as a coaxial cable according to another embodiment of the present disclosure.

FIG. 9 shows a cross-sectional diagram of a metal layer 630 as a coaxial cable according to another embodiment of the present disclosure. In the present embodiment, the metal layer 630 includes conductive traces 632, 634 and 636 that are separated by a dielectric layer 640. The conductive trace 632 can be used to transmit a high-frequency signal while the conductive traces 634 and 636 can be coupled to a ground. In such case, the conductive traces 632, 634 and 636 can be used as a 3D waveguide. However, the present disclosure is not limited thereto. In some other embodiments, the conductive traces 632, 634 and 636 can also be used as a π-type or a T-type impedance matching filter. (The structures of the upper and lower parts for connecting to the external circuits and ground points are not shown in FIG. 9).

In some embodiments, the conductive traces 632, 634 and 636 may be formed by the processes described above and illustrated. In such case, each of the conductive traces 632, 634 and 636 may include a first barrier layer B1, a first copper-phosphorous alloy layer P1, at least one copper layer C1, a second barrier layer B2, and a second copper-phosphorous alloy layer P1. However, the present disclosure is not limited thereto.

In some embodiments, the conductive traces 634 and 636 may run parallel to the conductive trace 632 so as to contain an electromagnetic field caused by a high-frequency signal transmitted by the conductive trace 632.

In some embodiments, the conductive traces 632, 634, and 636 extend horizontally along an X-Y plane; however, the present disclosure is not limited thereto. In other embodiments, when the conductive traces extend vertically along a Z direction, a similar electromagnetic shield structure is adopted.

Figure 10:
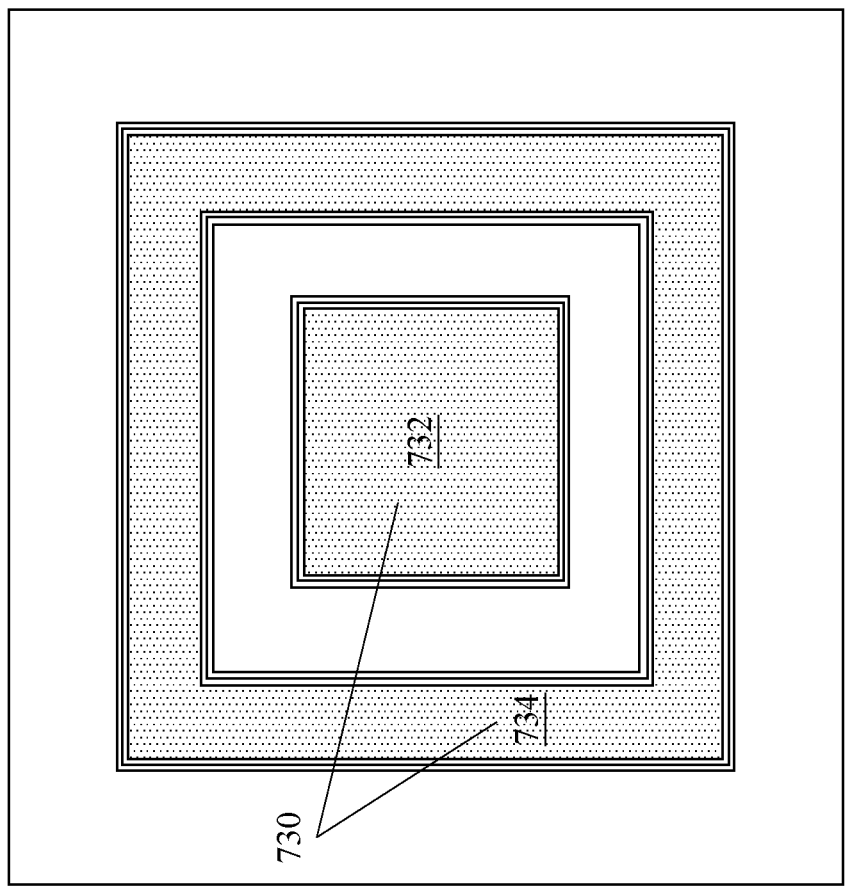
FIG. 10 shows a top view of the metal layer according to another embodiment of the present disclosure.

FIG. 10 shows a top view of the metal layer 730 according to one embodiment of the present disclosure. In the present embodiment, the metal layer 730 includes conductive traces 732 and 734 that extend upward along a direction Z. In such embodiment, the conductive trace 734, which is coupled to ground, surrounds the conductive trace 732, which is used to transmit a high-frequency signal. As a result, the conductive trace 734 provides a thorough shield wall (such as a coaxial cable) to mitigate the EMI issue. However, the present disclosure is not limited thereto. In some other embodiments, the inner conductive trace 732 can be grounded, while the outer conductive trace 734 can be applied to transmit a high frequency signal, then the circuit can be applied as one of the π-type or T-type impedance matching filter. (The structures of the upper and lower parts for connecting to the external circuits and ground points are not shown in FIG. 10).

Furthermore, in some embodiments, to increase a surface area that allows a high-frequency current to flow, multiple conductive traces may be adopted to transmit a same high frequency signal.

Figure 11:
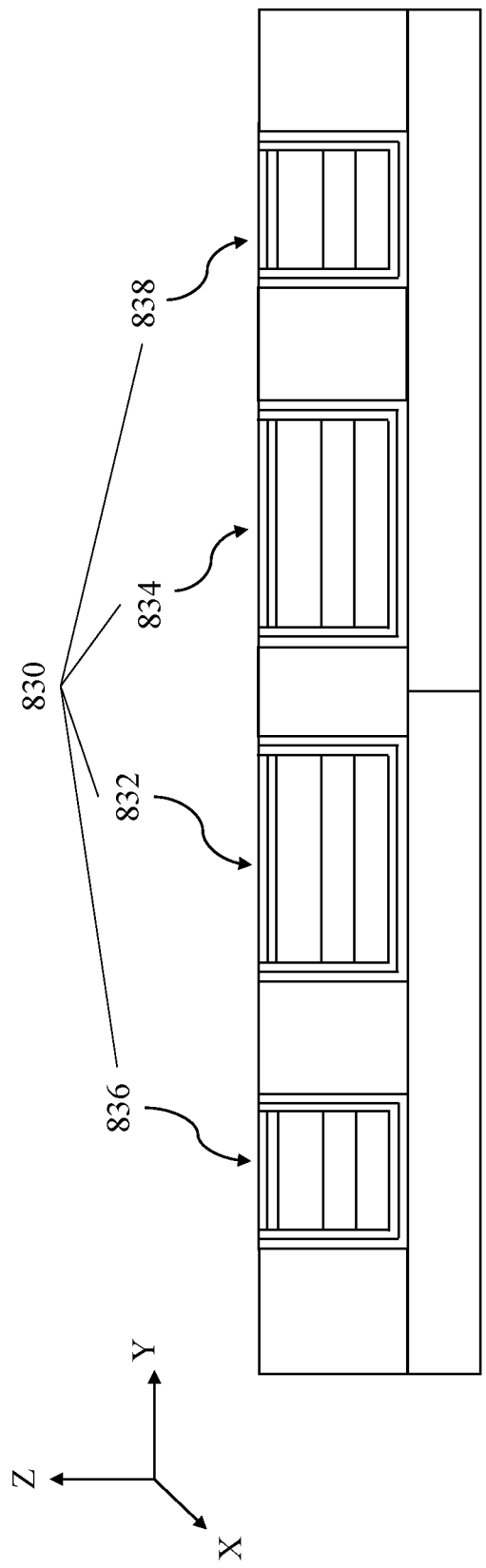
FIG. 11 shows a cross-sectional diagram of a metal layer as a pair of waveguides according to another embodiment of the present disclosure.

FIG. 11 shows a cross-sectional diagram of a metal layer 830 as a pair of waveguides according to another embodiment of the present disclosure. In the present embodiment, the metal layer 830 includes conductive traces 832, 834, 836 and 838, which extend along an X-Y plane. The conductive traces 832 and 834 are used to transmit a same high frequency signal, and the conductive traces 836 and 838 are coupled to the ground. In such embodiment, the metal layer 830 can be adopted as a pair of waveguides for transmitting high frequency signals, and a total surface area, through which the high frequency current flows, can be increased, thereby improving signal transmission efficiency. On the other hand, the metal layer 830 can also be used as a π-type or T-type impedance matching filter. (The structures of the upper and lower parts for connecting to the external circuits and ground points are not shown in FIG. 11).

Figure 12:
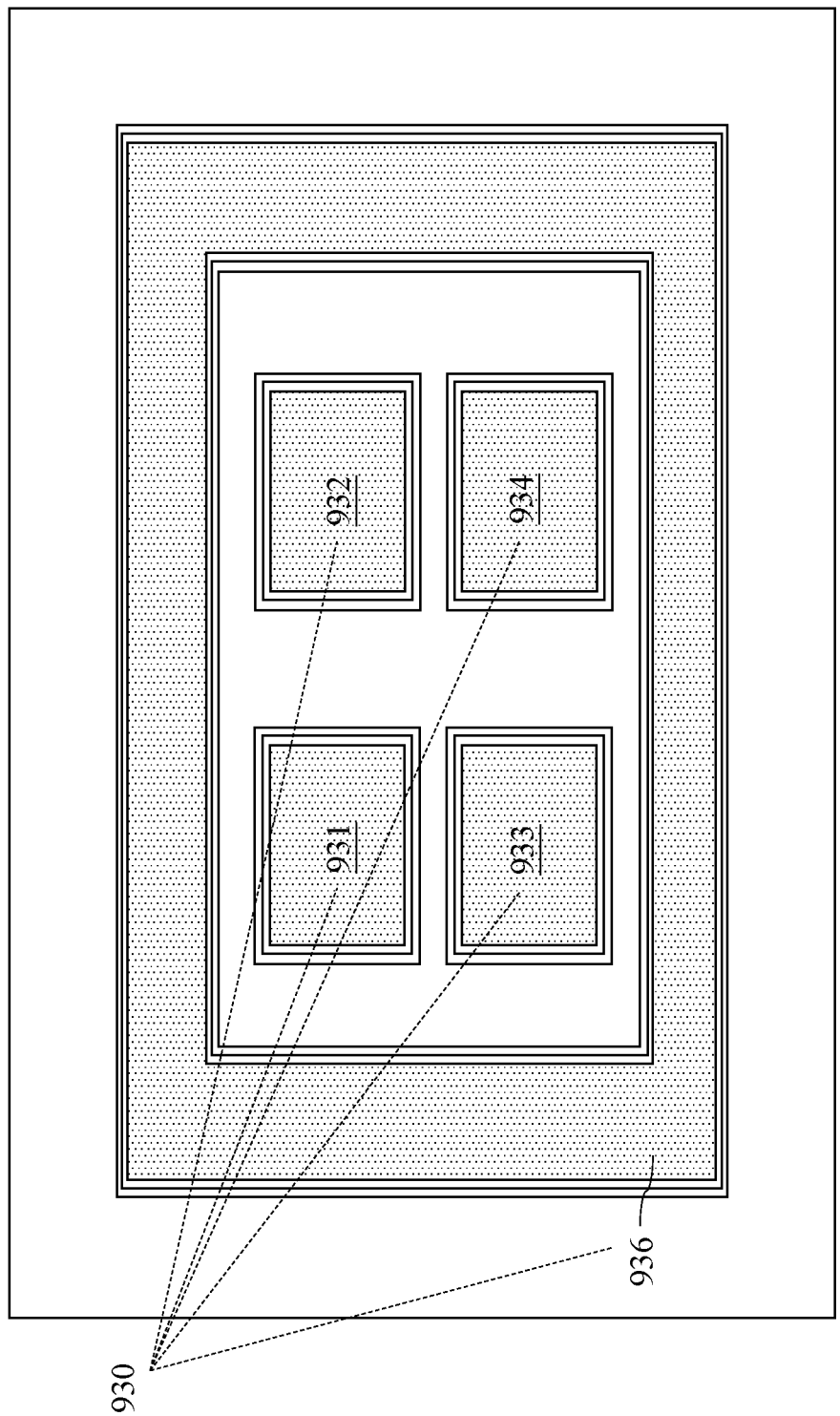
FIG. 12 shows a top view of the metal layer as a coaxial cable with multiple conductive traces in the center according to another embodiment of the present disclosure.

FIG. 12 shows a top view of the metal layer 930 as a coaxial cable with multiple conductive traces in the center according to one embodiment of the present disclosure. In the present embodiment, the metal layer 930 includes conductive traces 931, 932, 933, 934 and 936, which extend along the Z direction. The conductive traces 931, 932, 933 and 934 are used to transmit a same high-frequency signal, and the conductive trace 936 is coupled to ground.

In such embodiment, since the conductive traces 931, 932, 933 and 934 are surrounded by the conductive trace 936, EMI caused by the high-frequency signal transmitted by the conductive traces 931, 932, 933 and 934 can be shielded. Therefore, in some embodiments, the conductive traces 931, 932, 933 and 934 can be applied as a coaxial cable between a pair of upper and lower circuits. Furthermore, as even more conductive traces are adopted to transmit the same high frequency signal, a total surface area through which the high-frequency current flows can be further increased. Through proper design, this basic circuit can be applied as one of the pin connections of the semiconductor (e. g. Si) interposer (e. g. TSV), in which the coupling among the pins can be reduced. On the other hand, the inner conductive traces 931, 932, 933 and 934 can be grounded, while the outer conductive trace 936 can be applied to transmit a high frequency signal, then the circuit can be applied as one of the it-type or T-type impedance matching filters. (The structures of the upper and lower parts for connecting to the external circuits and ground points are not shown in FIG. 12).

In summary, the semiconductor structures and methods for manufacturing the semiconductors provided by the embodiments of the present disclosure allow formation of the interconnects and conductive traces to reduce the use of copper CMP processes. Therefore, the manufacturing time and cost can be reduced. In addition, the interconnects and/or the conductive traces in the semiconductor structures can be adopted to make 3D MMICs, which not only decreases the circuit area but also increases the circuit performance. Furthermore, by burying dielectric bodies within conductive traces and interconnects, surface areas of the conductive traces and interconnects can be increased. As a result, the transmission efficiency of high-frequency signals can also be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
    a conductive line of an $N^{th}$ metal layer, wherein N is equal to 1 or greater;
    a first insulating layer on the conductive line and free from covering a portion of the conductive line;
    a first dielectric layer on the first insulating layer and free from covering the portion of the conductive line and a portion of the first insulating layer;
    a second insulating layer on the first dielectric layer and free from covering the portion of the conductive line;
    an interconnect base laterally surrounded by the first dielectric layer, the first insulating layer, and the second insulating layer, wherein a top surface of the interconnect base and a top surface of the second insulating layer are coplanar;
    an interconnect body over the second insulating layer and in contact with the top surface of the interconnect base; and
    a second dielectric layer configured to isolate the interconnect body from a conductive trace over the second insulating layer;
    wherein the interconnect body comprises:
        a first barrier layer in direct contact with the interconnect base and sidewalls of the second dielectric layer;
        at least one conductive layer surrounded by the barrier layer;
        a first copper-phosphorous alloy layer sandwiched by the first barrier layer and the at least one conductive layer;
        a second copper-phosphorous alloy layer formed on the at least one conductive layer; and
        a second barrier layer formed on the second copper-phosphorous alloy layer.

2. The semiconductor structure of claim 1, wherein a dielectric constant of the first dielectric layer is less than dielectric constants of the first insulating layer and the second insulating layer.

3. The semiconductor structure of claim 1, wherein the interconnect base comprises:
    a barrier layer in direct contact with the first insulating layer and the second insulating layer;
    a copper layer surrounded by the barrier layer; and
    a copper-phosphorous alloy layer sandwiched by the barrier layer and the copper layer.

4. The semiconductor structure of claim 1, further comprising:
    a first conductive trace on the second insulating layer,
    wherein the interconnect body and the first conductive trace are parts of conductive lines of an $(N+1)^{th}$ metal layer, and are laterally spaced by a second dielectric layer, and
    wherein the first conductive trace overlaps the first dielectric layer along a stacking direction of the semiconductor structure.

5. The semiconductor structure of claim 4, further comprising:
    a dielectric body formed in the first conductive trace or the interconnect body.

6. The semiconductor structure of claim 4, further comprising a second conductive trace adjacent to the first conductive trace, the first conductive trace is configured to transmit a high-frequency signal, the second conductive trace is coupled to a ground, and the first conductive trace is separated from the second conductive trace by a second dielectric layer.

7. The semiconductor structure of claim 6, wherein the second conductive trace surrounds the first conductive trace.

8. The semiconductor structure of claim 7, further comprising a third conductive trace configured to transmit the high-frequency signal with the first conductive trace, the second conductive trace surrounds the first conductive trace and the third conductive trace, and the first conductive trace is separated from the third conductive trace by the second dielectric layer.

9. The semiconductor structure of claim 6, further comprises a fourth conductive trace coupled to the ground, the first conductive trace is disposed between the second conductive trace and the fourth conductive trace, and the first conductive trace is separated from the fourth conductive trace by the second dielectric layer.

10. The semiconductor structure of claim 9, further comprising a fifth conductive trace configured to transmit the high-frequency signal with the first conductive trace, and the first conductive trace and the fifth conductive trace are disposed between the second conductive trace and the fourth conductive trace.

11. The semiconductor structure of claim 4, wherein a thickness of the interconnect body is different from a thickness of the first conductive trace.

12. The semiconductor structure of claim 1, wherein the at least one conductive layer comprises at least one metal materials of copper, cobalt, and ruthenium.

13. The semiconductor structure of claim 1, wherein a multi-layer 3D monolithic microwave integrated circuit (MMIC) is formed within the semiconductor structure, and the multi-layer 3D MMIC comprises the interconnect base.

14. The semiconductor structure of claim 1, wherein the interconnect base is a part of a waveguide, a band pass filter, a band stop filter, a it-type impedance matching filter, or a T-type impedance matching filter.

15. A method of manufacturing a semiconductor structure, comprising:
   receiving a wafer having a conductive line of an $N^{th}$ metal layer at a surface of the wafer, wherein N is equal to 1 or greater;
   forming a first insulating layer on the surface of the wafer and free from covering a portion of the conductive line;
   forming a first dielectric layer on the first insulating layer and free from covering the portion of the conductive line and a portion of the first insulating layer;
   forming a second insulating layer on the first dielectric layer and the first insulating layer, wherein the second insulating layer comprises at least a base region over the portion of the conductive line and free from covering the portion of the conductive line;
   forming an interconnect base in the base region, comprising:
      forming a photoresist layer over the second insulating layer, wherein the base region of the second insulating layer is free from covered by the photoresist layer;
      forming at least one conductive material over the photoresist layer, the second insulating layer, and the conductive line, wherein an upper surface of the conductive material over the conductive line is substantially coplanar with an upper surface of the second insulating layer; and
      removing the conductive material over the second insulating layer by removing the photoresist layer to form the interconnect base;
   forming a second dielectric layer over the second insulating layer;
   forming a first conductive trace on the second insulating layer; and
   forming an interconnect body on the interconnect base;
   wherein the interconnect base is laterally surrounded by the first dielectric layer, the first insulating layer, and the second insulating layer;
   wherein the interconnect body is isolated from the first conductive trace by the second dielectric layer; and
   wherein the operation of forming the interconnect body on the interconnect base comprises:
      forming a first barrier layer in direct contact with the interconnect base and sidewalls of the second dielectric layer;
      forming a first copper-phosphorous alloy layer;
      forming at least one conductive layer surrounded by the barrier layer, wherein the first copper-phosphorous alloy layer is sandwiched by the first barrier layer and the at least one conductive layer;
      forming a second copper-phosphorous alloy layer on the at least one conductive layer; and
      forming a second barrier layer on the second copper-phosphorous alloy layer.

16. The method of claim 15, wherein a dielectric constant of the first dielectric layer is less than dielectric constants of the first insulating layer and the second insulating layer.

17. The method of claim 15, wherein the operation of forming at least one conductive material over the photoresist layer, the second insulating layer, and the conductive line comprises:
   forming a barrier layer in the base region, wherein the barrier layer is in contact with a side of the first insulating layer and a side of the second insulating layer;
   forming a copper-phosphorous alloy layer on the barrier layer; and
   plating a copper layer on the copper-phosphorous alloy layer.

18. The method of claim 17, wherein the operation of plating the copper layer on the copper-phosphorous alloy layer comprises:
   using electro-plating or electroless plating to form the copper layer with a predetermined thickness so that a top surface of the second insulating layer and a top surface of the interconnect base formed in the base region are coplanar.

19. The method of claim 15,
   wherein the first conductive trace overlaps the first dielectric layer along a stacking direction of the semiconductor structure.

20. The method of claim 15, further comprising:
   forming at least one dielectric body in the first conductive trace.

21. The method of claim 15, further comprising forming an $(N+1)^{th}$ metal layer comprising conductive traces and interconnect bodies having q different thicknesses, wherein:
   q is integers greater than 1;
   the conductive traces and interconnect bodies are formed by q metal plating processes and q different lift-off processes from conductive traces or interconnect bodies having a smallest thickness to conductive traces or interconnect bodies having a largest thickness.

22. The method of claim 15, wherein the semiconductor structure further comprising a plurality of interconnect bases having p different thicknesses, p is an integer greater than 1, and the interconnect bodies are formed by p metal plating processes and p different lift-off processes from interconnect bases having a smallest thickness to interconnect bases having a largest thickness.

23. The method of claim 15, wherein the conductive lines comprise input/output electrodes of transistors formed in the wafer, and the method further comprises forming the input/output electrodes, comprising:
   forming an inter-layer dielectric layer over transistors that are formed in a substrate of the wafer;
   forming a first silicate glass layer on the inter-layer dielectric layer;
   forming a first silicon nitride (SiN) layer on parts of the first silicate glass layer that are disposed on first terminals of the transistors at a first depth;
   forming a second silicate glass layer on the first silicate glass layer and the first SiN layer;
   forming a second SiN layer on the second silicate glass layer;
   forming first openings on second terminals of the transistors at a second depth that is deeper than the first depth;

depositing a first layer of electrode metal to fill the first openings;
removing exposed portions of the second silicate glass layer;
forming second openings on the first terminals of the transistors;
depositing a second layer of electrode metal to fill the second openings; and
removing the first SiN layer and the second SiN layer;
wherein the electrode metal comprises tungsten, cobalt or ruthenium.

24. The method of claim 15, wherein the semiconductor structure further comprising a plurality of electrodes having r different thicknesses, r is an integer greater than 1, and the electrodes are formed by r metal plating processes and r lift-off processes from electrodes having a smallest thickness to electrodes having a largest thickness.

* * * * *